US010100421B2

(12) United States Patent
Thorseth et al.

(10) Patent No.: US 10,100,421 B2
(45) Date of Patent: Oct. 16, 2018

(54) METHOD OF ELECTROPLATING PHOTORESIST DEFINED FEATURES FROM COPPER ELECTROPLATING BATHS CONTAINING REACTION PRODUCTS OF IMIDAZOLE AND BISEPOXIDE COMPOUNDS

(71) Applicants: Rohm and Haas Electronic Materials LLC, Marlborough, MA (US); Dow Global Technologies LLC, Midland, MI (US)

(72) Inventors: Matthew Thorseth, Westminster, MA (US); Zuhra Niazimbetova, Westborough, MA (US); Yi Qin, Westborough, MA (US); Julia Woertink, Midland, MI (US); Joanna Dziewiszek, Boxborough, MA (US); Erik Reddington, Ashland, MA (US); Mark Lefebvre, Hudson, NH (US)

(73) Assignees: Dow Global Technologies LLC, Midland, MI (US); Rohm and Haas Electronic Materials LLC, Marlborough, MA (US)

(*) Notice: Subject to any disclaimer, the term of this patent is extended or adjusted under 35 U.S.C. 154(b) by 132 days.

(21) Appl. No.: 15/220,467

(22) Filed: Jul. 27, 2016

(65) Prior Publication Data

US 2017/0037526 A1 Feb. 9, 2017

Related U.S. Application Data

(60) Provisional application No. 62/201,881, filed on Aug. 6, 2015.

(51) Int. Cl.
*C25D 3/38* (2006.01)
*C25D 5/02* (2006.01)
(Continued)

(52) U.S. Cl.
CPC .............. *C25D 3/38* (2013.01); *C25D 5/022* (2013.01); *C25D 7/00* (2013.01); *C25D 7/12* (2013.01);
(Continued)

(58) Field of Classification Search
CPC . C25D 3/18; C25D 5/022; C25D 7/00; C25D 7/12; C25D 7/123; G03F 7/405;
(Continued)

(56) References Cited

U.S. PATENT DOCUMENTS 6,229,220 B1 5/2001 Saitoh et al.
6,578,754 B1 6/2003 Tung
(Continued)

FOREIGN PATENT DOCUMENTS

EP 1619274 1/2006
EP 2199315 6/2010
(Continued)

OTHER PUBLICATIONS

Han, M. Li, H. Sun and J. Sun, "The study on the shaping of electroplated copper pillar bumping," 2011 12th International Conference on Electronic Packaging Technology and High Density Packaging, Shanghai, 2011, pp. 1-4. (Year: 2011).*
(Continued)

*Primary Examiner* — Louis J Rufo
(74) *Attorney, Agent, or Firm* — John J. Piskorski (57) ABSTRACT

Electroplating methods enable the plating of photoresist defined features which have substantially uniform morphology. The electroplating methods include copper electroplating baths with reaction products of imidazole and bisepoxides to electroplate the photoresist defined features. Such features include pillars, bond pads and line space features.

8 Claims, 2 Drawing Sheets

(51) Int. Cl.
| | |
|---|---|
| *C25D 7/00* | (2006.01) |
| *C25D 7/12* | (2006.01) |
| *G03F 7/40* | (2006.01) |
| *H05K 1/11* | (2006.01) |
| *H05K 3/06* | (2006.01) |
| *H05K 3/40* | (2006.01) |
| *H01L 23/00* | (2006.01) |
| *H01L 21/768* | (2006.01) |
| *H01L 23/522* | (2006.01) |
| *H01L 23/532* | (2006.01) |

(52) U.S. Cl.
CPC .............. *C25D 7/123* (2013.01); *G03F 7/405* (2013.01); *H01L 21/76879* (2013.01); *H01L 23/5226* (2013.01); *H01L 23/53228* (2013.01); *H01L 24/03* (2013.01); *H01L 24/05* (2013.01); *H01L 24/11* (2013.01); *H01L 24/13* (2013.01); *H05K 1/11* (2013.01); *H05K 3/064* (2013.01); *H05K 3/4007* (2013.01); *H01L 2224/03462* (2013.01); *H01L 2224/05147* (2013.01); *H01L 2224/11* (2013.01); *H01L 2224/11462* (2013.01); *H01L 2224/13147* (2013.01); *H05K 2201/09209* (2013.01)

(58) Field of Classification Search
CPC ........... H01L 21/76879; H01L 23/5226; H01L 23/53228; H01L 24/03; H01L 24/05; H01L 24/11; H01L 24/13; H01L 2224/03465; H01L 2224/05147; H01L 2224/11; H01L 2224/11462; H01L 2224/13147; H05K 1/11; H05K 3/4007; H05K 2201/09209
See application file for complete search history.

(56) References Cited

U.S. PATENT DOCUMENTS

| | | |
|---|---|---|
| 6,610,192 B1 | 8/2003 | Step et al. |
| 6,800,188 B2 | 10/2004 | Hagiwara et al. |
| 7,128,822 B2 | 10/2006 | Wang et al. |
| 7,276,801 B2 | 10/2007 | Dubin et al. |
| 7,374,652 B2 | 5/2008 | Hayashi et al. |
| 7,462,942 B2 | 12/2008 | Tan et al. |
| 7,829,380 B2 | 11/2010 | Irsigler et al. |
| 8,262,894 B2 | 9/2012 | Xu et al. |
| 8,454,815 B2 | 6/2013 | Niazimbetova et al. |
| 8,592,995 B2 | 11/2013 | Lin et al. |
| 8,945,995 B2 | 2/2015 | Nah et al. |
| 8,957,524 B2 | 2/2015 | Breuer et al. |
| 2004/0249177 A1 | 12/2004 | Wang et al. |
| 2007/0007143 A1 | 1/2007 | Hayashi et al. |
| 2011/0089044 A1 | 4/2011 | Isono et al. |
| 2011/0220512 A1 | 9/2011 | Niazimbetova et al. |
| 2011/0220514 A1* | 9/2011 | Niazimbetova ...... C07D 233/02 205/297 |
| 2012/0043654 A1 | 2/2012 | Lu et al. |
| 2013/0068626 A1 | 3/2013 | Siemer et al. |
| 2013/0313011 A1 | 11/2013 | Hu et al. |
| 2014/0252592 A1 | 9/2014 | Zhou et al. |
| 2014/0262799 A1 | 9/2014 | Jayaraju et al. |

FOREIGN PATENT DOCUMENTS

| | | |
|---|---|---|
| WO | 2011064154 | 6/2011 |
| WO | 2011113908 | 9/2011 |
| WO | 2011151785 | 12/2011 |

OTHER PUBLICATIONS

Search report for corresponding Europe Application No. 16182477 dated Dec. 7, 2016.
Search report for corresponding Taiwan Application No. 105123887 dated Mar. 27, 2017.
Han, Y. "The Study on the Shaping of Electroplated Copper Pillar Bumping" p. 1-4, Shanghai Jiao Tong University, Shanghai.
Hayashi, K. "Shape Evolution of Electrodeposited Bumps into Deep Cavities" Journal of The Electrochemical Society, Aug. 28, 2000, p. 1-4, Okayama, Japan.
Koh, W., "Copper Pillar Bump Technology Progress Overview" p. 1-6, Powertech Technology Inc., Taiwan, China.
Kondo, K., "Shape Evolution of Electrodeposited Bumps with Shallow and Deep Cavities" Journal of The Electrochemical Society, Oct. 9, 2009, p. 1-5, Sakai, Japan.
McCormick, H., "Assembly and Reliability Assessment of Fine Pitch TMV Package on Package (PoP) Components" p. 1-8, Celestica Inc. Toronto, ON, Canada. Amkor Technology Inc., Chandler, AZ, USA.
Osborn, T., "All-Copper Chip-to-Substrate Interconnects Part I. Fabrication and Characterization" Journal of The Electrochemical Society. Dec. 20, 2007, p. 1-6, Georgia Institute of Technology, Atlanta, Georgia.
U.S. Appl. No. 15/220,460, filed Jul. 27, 2016, titled: Method of Electroplating Photoresist Defined Features From Copper Electroplating Baths Containing Reaction Products of Pyridyl Alkylamines and Bisepoxides.
U.S. Appl. No. 15/220,472, filed Jul. 27, 2016, titled: Method of Electroplating Photoresist Defined Features From Copper Electroplating Baths Containing Reaction Products of Alpha Amino Acids and Bisepoxdes.
U.S. Appl. No. 15/220,476, filed Jul. 27, 2016, titled: Method of Electroplating Photoresist Defined Features From Copper Electroplating Baths Containing Reaction Products of Imidazole Compounds, Bisepoxides and Halobenzyl Compounds.
Hsu, et al, "A novel high coplanarity lead free copper pillar bump fabrication process", Proceedings of the IEEE 2009 International Interconnect Technology Conference, Jun. 2009, pp. 169-170.
Search report for corresponding China Application No. 201610621009.3 dated Nov. 30, 2017.

* cited by examiner

METHOD OF ELECTROPLATING PHOTORESIST DEFINED FEATURES FROM COPPER ELECTROPLATING BATHS CONTAINING REACTION PRODUCTS OF IMIDAZOLE AND BISEPOXIDE COMPOUNDS

FIELD OF THE INVENTION

The present invention is directed to a method of electroplating photoresist defined features from copper electroplating baths which include reaction products of imidazole and bisepoxide compounds. More specifically, the present invention is directed to a method of electroplating photoresist defined features from copper electroplating baths which include reaction products of imidazole and bisepoxide compounds where the features have substantially uniform surface morphology.

BACKGROUND OF THE INVENTION

Photoresist defined features include copper pillars and redistribution layer wiring such as bond pads and line space features for integrated circuit chips and printed circuit boards. The features are formed by the process of lithography where a photoresist is applied to a substrate such as a semiconductor wafer chip often referred to as a die in packaging technologies, or epoxy/glass printed circuit boards. In general, the photoresist is applied to a surface of the substrate and a mask with a pattern is applied to the photoresist. The substrate with the mask is exposed to radiation such as UV light. Typically the sections of the photoresist which are exposed to the radiation are developed away or removed exposing the surface of the substrate. Depending on the specific pattern of the mask an outline of a circuit line or aperture may be formed with the unexposed photoresist left on the substrate forming the walls of the circuit line pattern or apertures. The surface of the substrate includes a metal seed layer or other conductive metal or metal alloy material which enables the surface of the substrate conductive. The substrate with the patterned photoresist is then immersed in a metal electroplating bath, typically a copper electroplating bath, and metal is electroplated in the circuit line pattern or aperture to form features such as pillars, bond pads or circuit lines, i.e., line space features. When electroplating is completed, the remainder of the photoresist is stripped from the substrate with a stripping solution and the substrate with the photoresist defined features is further processed.

Pillars, such as copper pillars, are typically capped with solder to enable adhesion as well as electrical conduction between the semiconductor chip to which the pillars are plated and a substrate. Such arrangements are found in advanced packaging technologies. Solder capped copper pillar architectures are a fast growing segment in advanced packaging applications due to improved input/output (I/O) density compared to solder bumping alone. A copper pillar bump with the structure of a non-reflowable copper pillar and a reflowable solder cap has the following advantages: (1) copper has low electrical resistance and high current density capability; (2) thermal conductivity of copper provides more than three times the thermal conductivity of solder bumps; (3) can improve traditional BGA CTE (ball grid array coefficient of thermal expansion) mismatch problems which can cause reliability problems; and (4) copper pillars do not collapse during reflow allowing for very fine pitch without compromising stand-off height.

Of all the copper pillar bump fabrication processes, electroplating is by far the most commercially viable process. In the actual industrial production, considering the cost and process conditions, electroplating offers mass productivity and there is no polishing or corrosion process to change the surface morphology of copper pillars after the formation of the copper pillars. Therefore, it is particularly important to obtain a smooth surface morphology by electroplating. The ideal copper electroplating chemistry for electroplating copper pillars yields deposits with excellent uniformity, flat pillar shape and void-free intermetallic interface after reflow with solder and is able to plate at high deposition rates to enable high wafer through-out. However, development of such plating chemistry is a challenge for the industry as improvement in one attribute typically comes at the expense of another. Copper pillar based structures have already been employed by various manufacturers for use in consumer products such as smart phones and PCs. As Wafer Level Processing (WLP) continues to evolve and adopt the use of copper pillar technology, there will be increasing demand for copper plating baths with advanced capabilities that can produce reliable copper pillar structures.

Similar problems of morphology are also encountered with the metal electroplating of redistribution layer wiring. Defects in the morphology of bond pads and line space features also compromise the performance of advanced packaging articles. Accordingly, there is a need for a copper electroplating method which provides copper photoresist defined features where the features have substantially uniform surface morphology.

SUMMARY OF THE INVENTION

A method of electroplating photoresist defined features including: a) providing a substrate comprising a layer of photoresist, wherein the layer of photoresist includes a plurality of apertures; b) providing a copper electroplating bath including one or more reaction products of one or more imidazole compounds and one or more bisepoxides; an electrolyte; one or more accelerators; and one or more suppressors; c) immersing the substrate including the layer of photoresist with the plurality of apertures in the copper electroplating bath; and d) electroplating a plurality of copper photoresist defined features in the plurality of apertures, the plurality of photoresist defined features include an average % TIR of 5% to 8%.

Copper electroplating baths include a reaction product of one or more imidazole compounds and one or more bisepoxides, an electrolyte, one or more sources of copper ions, one or more accelerators and one or more suppressors in sufficient amounts to electroplate copper photoresist defined features having an average % TIR of 5% to 8%.

The present invention is also directed to an array of photoresist defined features on a substrate comprising an average % TIR of 5% to 8% and a % WID of 5% to 12%.

The copper electroplating methods and baths provide copper photoresist defined features which have a substantially uniform morphology and are substantially free of nodules. The copper pillars and bond pads have a substantially flat profile. The copper electroplating baths and methods enable an average % TIR to achieve the desired morphology.

DETAILED DESCRIPTION OF THE INVENTION

As used throughout this specification the following abbreviations shall have the following meanings unless the context clearly indicates otherwise: A=amperes; $A/dm^2$=amperes per square decimeter=ASD; ° C.=degrees Centigrade; UV=ultraviolet radiation; g=gram; ppm=parts per million=mg/L; L=liter, μm=micron=micrometer; mm=millimeters; cm=centimeters; DI=deionized; mL=milliliter; mmol=millimoles; Mw=weight average molecular weight; Mn=number average molecular weight; SEM=scanning electron microscope; FIB=focus ion beam; WID=within-die; TIR=total indicated runout=total indicator reading=full indicator movement=FIM; and RDL=redistribution layer.

As used throughout this specification, the term "plating" refers to metal electroplating. "Deposition" and "plating" are used interchangeably throughout this specification. "Accelerator" refers to an organic additive that increases the plating rate of the electroplating bath. "Suppressor" refers to an organic additive that suppresses the plating rate of a metal during electroplating. The term "array" means an ordered arrangement. The term "moiety" means a part of a molecule or polymer that may include either whole functional groups or parts of functional groups as substructures. The terms "moiety" and "group" are used interchangeably throughout the specification. The term "aperture" means opening, hole or gap. The term "morphology" means the form, shape and structure of an article. The term "total indicator runout" or "total indicator reading" is the difference between the maximum and minimum measurements, that is, readings of an indicator, on planar, cylindrical, or contoured surface of a part, showing its amount of deviation from flatness, roundness (circularity), cylindricity, concentricity with other cylindrical features or similar conditions. The term "profilometry" means the use of a technique in the measurement and profiling of an object or the use of a laser or white light computer-generated projections to perform surface measurements of three dimensional objects. The term "pitch" means a frequency of feature positions from each other on a substrate. The term "normalizing" means a rescaling to arrive at values relative to a size variable such as a ratio as % TIR. The term "average" means a number expressing the central or typical value of a parameter. The term "parameter" means a numerical or other measurable factor forming one of a set that defines a system or sets the conditions of its operation. The articles "a" and "an" refer to the singular and the plural.

All numerical ranges are inclusive and combinable in any order, except where it is clear that such numerical ranges are constrained to add up to 100%.

Methods and baths for electroplating copper photoresist defined features of the present invention enable an array of photoresist defined features having an average % TIR such that the features have a morphology which is substantially smooth, free of nodules and with respect to pillars, bond pads and line space features have substantially flat profiles. The photoresist defined features of the present invention are electroplated with photoresist remaining on the substrate and extend beyond the plane of the substrate. This is in contrast to dual damascene and printed circuit board plating which typically do not use photoresist to define features which extend beyond the plane of the substrate but are inlaid into the substrate. An important difference between photoresist defined features and damascene and printed circuit board features is that with respect to the damascene and printed circuit boards the plating surface including the sidewalls are all conductive. The dual damascene and printed circuit board plating baths have a formulation that provides bottom-up or super-conformal filling, with the bottom of the feature plating faster than the top of the feature. In photoresist defined features, the sidewalls are non-conductive photoresist and plating only occurs at the feature bottom with the conductive seed layer and proceeds in a conformal or same plating speed everywhere deposition.

While the present invention is substantially described with respect to methods of electroplating copper pillars having a circular morphology, the present invention also applies to other photoresist defined features such as bond pads and line space features. In general, the shapes of the features may be, for example, oblong, octagonal and rectangular in addition to circular or cylindrical. The methods of the present invention are preferably for electroplating copper cylindrical pillars.

The copper electroplating methods provide an array of copper photoresist defined features, such as copper pillars, with an average % TIR of 5% to 8%, preferably from 5% to 7%.

In general, the average % TIR for an array of photoresist defined features on a substrate involves determining the % TIR of individual features from the array of features on the single substrate and averaging them. Typically, the average % TIR is determined by determining the % TIR for individual features of a region of low density or larger pitch and the % TIR for individual features of a region of high density or smaller pitch on the substrate and averaging the values. By measuring the % TIR of a variety of individual features, the average % TIR becomes representative of the whole substrate.

The % TIR may be determined by the following equation:

$$\% \text{ TIR} = [\text{height}_{center} - \text{height}_{edge}]/\text{height}_{max} \times 100$$

where $\text{height}_{center}$ is the height of a pillar as measured along its center axis and $\text{height}_{edge}$ is the height of the pillar as measured along its edge at the highest point on the edge. $\text{Height}_{max}$ is the height from the bottom of the pillar to its highest point on its top. $\text{Height}_{max}$ is a normalizing factor. Individual feature TIRs may be determined by the following equation:

$$\text{TIR} = \text{height}_{center} - \text{height}_{edge},$$

where $\text{height}_{center}$ and $\text{height}_{edge}$ are as defined above.

In addition, the copper electroplating methods and baths may provide an array of copper photoresist defined features with a % WID of 5% to 12%, preferably from 5% to 8%. The % WID or within-die may be determined by the following equation:

$$\% \text{ WID} = \frac{1}{2} \times [(\text{height}_{max} - \text{height}_{min})/\text{height}_{avg}] \times 100$$

where $\text{height}_{max}$ is the height of the tallest pillar of an array of pillars electroplated on a substrate as measured at the tallest part of the pillar. $\text{Height}_{min}$ is the height of the shortest pillar of an array of pillars electroplated on the substrate as measured at the tallest part of the pillar. $\text{Height}_{avg}$ is the average height of all of the pillars electroplated on the substrate.

Most preferably, the methods of the present invention provide an array of photoresist defined features on a substrate where there is a balance between the average % TIR and % WID such that the average % TIR ranges from 5% to 8% and the % WID ranges from 5% to 12% with the preferred ranges as disclosed above.

The parameters of the pillars for determining TIR, % TIR and % WID may be measured using optical profilometry such as with a white light LEICA DCM 3D or similar apparatus. Parameters such as pillar height and pitch may be measured using such devices.

In general, the copper pillars electroplated from the copper electroplating baths may have aspect ratios of 3:1 to 1:1 or such as 2:1 to 1:1. RDL type structure may have aspect ratios as large as 1:20 (height:width).

Preferably the imidazole compounds have the following general formula:

(I)

where $R_1$, $R_2$ and $R_3$ are independently chosen from hydrogen, linear or branched ($C_1$-$C_{10}$)alkyl, hydroxyl, linear or branched alkoxy, linear or branched hydroxy($C_1$-$C_{10}$)alkyl, linear or branched alkoxy($C_1$-$C_{10}$)alkyl, linear or branched, carboxy($C_1$-$C_{10}$)alkyl, linear or branched amino($C_1$-$C_{10}$)alkyl, and substituted or unsubstituted phenyl where the substituents may be hydroxyl, hydroxy($C_1$-$C_3$)alkyl, or ($C_1$-$C_3$)alkyl. Preferably, $R_1$, $R_2$ and $R_3$ are independently chosen from hydrogen; linear or branched ($C_1$-$C_5$)alkyl, hydroxyl, linear or branched hydroxy($C_1$-$C_5$)alkyl, and linear or branched amino($C_1$-$C_5$)alkyl. More preferably $R_1$, $R_2$ and $R_3$ are independently chosen from hydrogen and ($C_1$-$C_3$)alky such as methyl, ethyl and propyl moieties. Even more preferably $R_1$, $R_2$ and $R_3$ are hydrogen, or $R_1$ and $R_2$ are methyl and $R_3$ is hydrogen. Examples of such compounds are 1H-imidazole, 2,5-dimethyl-1H-imidazole and 4-phenylimidazole.

Preferably bisepoxides have a formula:

(II)

where $R_4$ and $R_5$ are independently chosen from hydrogen and ($C_1$-$C_4$)alkyl; $R_6$ and $R_7$ are independently chosen from hydrogen, methyl and hydroxyl; m=1-6 and n=1-20. Preferably, $R_4$ and $R_5$ are hydrogen. Preferably $R_6$ is hydrogen, and $R_7$ is hydrogen or hydroxyl and when $R_7$ is hydroxyl and m=2-4, it is preferred that only one $R_7$ is hydroxyl with the remainder hydrogen. Preferably m=2-4 and n=1-2. More preferably m=3-4 and n=1.

Compounds of formula (II) include, but are not limited to, 1,4-butanediol diglycidyl ether, ethylene glycol diglycidyl ether, di(ethylene glycol)diglycidyl ether, 1,3-butanediol diglycidyl ether, glycerol diglycidyl ether, neopentyl glycol diglycidyl ether, propylene glycol diglycidyl ether, di(propylene glycol)diglycidyl ether, poly(ethylene glycol)diglycidyl ether compounds and poly(propylene glycol)diglycidyl ether compounds.

Additional preferred bisepoxides include bisepoxides having cyclic carbon moieties such as those having six carbon cyclic moieties. Such bisepoxides include, but are not limited to, 1,4-cyclohexanedimethanol diglycidyl ether and resorcinol diglycidyl ether.

The reaction products of the present invention may be prepared by various processes known in the art. Typically, one or more imidazole compounds are dissolved in DI water at room temperature followed by dropwise addition of one or more bisepoxides. The temperature of the bath is then increased from room temperature to around 90° C. Heating with stirring is done for 2-5 hours. The temperature of the heating bath is then reduced to room temperature with stirring for an additional 4-8 hours. The amounts for each component may vary but, in general, sufficient amount of each reactant is added to provide a product where the molar ratio of the moiety from the imidazole compound to the moiety from the bisepoxide ranges from 3:1 to 1:1, preferably from 2:1 to 1:2, most preferably from 1.2:1 to 1:1.2.

The aqueous copper electroplating baths contain a source of metal ions, an electrolyte, and a reaction product of one or more imidazole compounds and one or more bisepoxides. The aqueous copper electroplating baths also include an accelerator, a suppressor and optionally a source of halide ions. Metals which may be electroplated from the baths to form copper pillars include copper and copper/tin alloy. Preferably copper metal is electroplated.

Suitable copper ion sources are copper salts and include without limitation: copper sulfate; copper halides such as copper chloride; copper acetate; copper nitrate; copper tetrafluoroborate; copper alkylsulfonates; copper aryl sulfonates; copper sulfamate; copper perchlorate and copper gluconate. Exemplary copper alkane sulfonates include copper ($C_1$-$C_6$)alkane sulfonate and more preferably copper ($C_1$-$C_3$)alkane sulfonate. Preferred copper alkane sulfonates are copper methanesulfonate, copper ethanesulfonate and copper propanesulfonate. Exemplary copper arylsulfonates include, without limitation, copper benzenesulfonate and copper p-toluenesulfonate. Mixtures of copper ion sources may be used. One or more salts of metal ions other than copper ions may be added to the present electroplating baths. Typically, the copper salt is present in an amount sufficient to provide an amount of copper ions of 30 to 60 g/L of plating solution. Preferably the amount of copper ions is from 40 to 50 g/L.

The electrolyte useful in the present invention may be alkaline or acidic. Preferably the electrolyte is acidic. Preferably, the pH of the electrolyte is ≤2. Suitable acidic electrolytes include, but are not limited to, sulfuric acid, acetic acid, fluoroboric acid, alkanesulfonic acids such as methanesulfonic acid, ethanesulfonic acid, propanesulfonic acid and trifluoromethane sulfonic acid, aryl sulfonic acids such as benzenesulfonic acid, p-toluenesulfonic acid, sulfamic acid, hydrochloric acid, hydrobromic acid, perchloric acid, nitric acid, chromic acid and phosphoric acid. Mixtures of acids may be advantageously used in the present metal plating baths. Preferred acids include sulfuric acid, methanesulfonic acid, ethanesulfonic acid, propanesulfonic acid, hydrochloric acid and mixtures thereof. The acids may be present in an amount in the range of 1 to 400 g/L. Electrolytes are generally commercially available from a variety of sources and may be used without further purification.

Such electrolytes may optionally contain a source of halide ions. Typically chloride ions and bromide ions are used. Exemplary chloride ion sources include copper chloride, tin chloride, sodium chloride, potassium chloride and hydrochloric acid. Examples of sources of bromide ions are sodium bromide, potassium bromide and hydrogen bromide. A wide range of halide ion concentrations may be used in the present invention. Typically, the halide ion concentration is in the range of 0 to 100 mg/L based on the plating bath. Preferably halide ions are included in amounts of 50 to 80 mg/L. Such halide ion sources are generally commercially available and may be used without further purification.

The aqueous copper electroplating baths contain an accelerator. Any accelerators (also referred to as brightening agents) are suitable for use in the present invention. Such accelerators are well-known to those skilled in the art. Accelerators include, but are not limited to, N,N-dimethyl-dithiocarbamic acid-(3-sulfopropyl)ester; 3-mercapto-propylsulfonic acid-(3-sulfopropyl)ester; 3-mercapto-propylsulfonic acid sodium salt; carbonic acid,dithio-O-ethylester-S-ester with 3-mercapto-1-propane sulfonic acid potassium salt; bis-sulfopropyl disulfide; bis-(sodium sulfopropyl)-disulfide; 3-(benzothiazolyl-S-thio)propyl sulfonic acid sodium salt; pyridinium propyl sulfobetaine; 1-sodium-3-mercapto-propane-1-sulfonate; N,N-dimethyl-dithiocarbamic acid-(3-sulfoethyl)ester; 3-mercapto-ethyl propylsulfonic acid-(3-sulfoethyl)ester; 3-mercapto-ethylsulfonic acid sodium salt; carbonic acid-dithio-O-ethylester-S-ester with 3-mercapto-1-ethane sulfonic acid potassium salt; bis-sulfoethyl disulfide; 3-(benzothiazolyl-S-thio)ethyl sulfonic acid sodium salt; pyridinium ethyl sulfobetaine; and 1-sodium-3-mercaptoethane-1-sulfonate. Accelerators may be used in a variety of amounts. In general, accelerators are used in an amount in a range of 0.1 ppm to 1000 ppm. Preferably the accelerators are included in amounts of 1 ppm to 50 ppm, more preferably from 5 ppm to 20 ppm.

Suitable suppressors include, but are not limited to, polypropylene glycol copolymers and polyethylene glycol copolymers, including ethylene oxide-propylene oxide ("EO/PO") copolymers and butyl alcohol-ethylene oxide-propylene oxide copolymers. The weight average molecular weight of the suppressors may range from 800-15000, preferably 1000-15,000. When such suppressors are used, they are preferably present in a range of 0.5 g/L to 15 g/L based on the weight of the composition, and more preferably from 1 g/L to 5 g/L.

In general, the reaction products have a number average molecular weight (Mn) of 200 to 100,000, typically from 300 to 50,000, preferably from 500 to 30,000, although reaction products having other Mn values may be used. Such reaction products may have a weight average molecular weight (Mw) value in the range of 1000 to 50,000, typically from 5000 to 30,000, although other Mw values may be used.

The amount of the reaction product used in the copper electroplating baths for plating photoresist defined features, preferably copper pillars, may range from 0.25 ppm to 20 ppm, preferably from 0.25 ppm to 10 ppm, more preferably from 0.25 ppm to 5 ppm, based on the total weight of the plating bath.

The electroplating baths may be prepared by combining the components in any order. It is preferred that the inorganic components such as source of metal ions, water, electrolyte and optional halide ion source are first added to the bath vessel, followed by the organic components such as reaction product, accelerator, suppressor, and any other organic component.

The aqueous copper electroplating baths may optionally contain a conventional leveling agent provided such the leveling agent does not substantially compromise the structure and function of the copper features. Such leveling agents may include those disclosed in U.S. Pat. No. 6,610,192 to Step et al., U.S. Pat. No. 7,128,822 to Wang et al., U.S. Pat. No. 7,374,652 to Hayashi et al. and U.S. Pat. No. 6,800,188 to Hagiwara et al. However, it is preferred that such leveling agents are excluded from the baths.

Typically, the plating baths may be used at any temperature from 10 to 65° C. or higher. Preferably, the temperature of the plating composition is from 15 to 50° C. and more preferably from 20 to 40° C.

In general, the copper electroplating baths are agitated during use. Any suitable agitation method may be used and such methods are well-known in the art. Suitable agitation methods include, but are not limited to: air sparging, work piece agitation, and impingement.

Typically, a substrate is electroplated by contacting the substrate with the plating bath. The substrate typically functions as the cathode. The plating bath contains an anode, which may be soluble or insoluble. Potential is applied to the electrodes. Current densities may range from 0.25 ASD to 40 ASD, preferably 1 ASD to 20 ASD, more preferably from 4 ASD to 18 ASD.

While the method of the present invention may be used to electroplate photoresist defined features such as pillars, bonding pads and line space features, the method is described in the context of plating copper pillars which is the preferred feature of the present invention. Typically, the copper pillars may be formed by first depositing a conductive seed layer on a substrate such as a semiconductor chip or die. The substrate is then coated with a photoresist material and imaged to selectively expose the photoresist layer to radiation such as UV radiation. The photoresist layer may be applied to a surface of the semiconductor chip by conventional processes known in the art. The thickness of the photoresist layer may vary depending on the height of the features. Typically the thickness ranges from 1 μm to 250 μm. A patterned mask is applied to a surface of the photoresist layer. The photoresist layer may be a positive or negative acting photoresist. When the photoresist is positive acting, the portions of the photoresist exposed to the radiation are removed with a developer such as an alkaline developer. A pattern of a plurality of apertures is formed on the surface which reaches all the way down to the seed layer on the substrate or die. The pitch of the pillars may range from 20 μm to 400 μm. Preferably the pitch may range from 40 μm to 250 μm. The diameters of the apertures may vary depending on the diameter of the feature. The diameters of the apertures may range from 2 μm to 200 μm, typically from 10 μm to 75 μm. The entire structure may then be placed in a copper electroplating bath containing one or more of the reaction products of the present invention. Electroplating is done to fill at least a portion of each aperture with a copper pillar with a substantially flat top. Electroplating is vertical fill without horizontal or superfilling. The entire structure with the copper pillars is then transferred to a bath containing solder, such as a tin solder or tin alloy solder such as a tin/silver or tin/lead alloy and a solder bump is electroplated on the substantially flat surface of each copper pillar to fill portions of the apertures. The remainder of the photoresist is removed by conventional means known in the art leaving an array of copper pillars with solder bumps on the die. The remainder of the seed layer not covered by pillars is removed through etching processes well known in the art. The copper pillars with the solder bumps are placed in contact with metal contacts of a substrate such as a printed circuit board, another wafer or die or an interposer which may be made of organic laminates, silicon or glass. The solder bumps are heated by conventional processes known in the art to reflow the solder and join the copper pillars to the metal contacts of the substrate. Conventional reflow processes for reflowing solder bumps may be used. An example of a reflow oven is FALCON 8500 tool from Sikiama International, Inc. which includes 5 heating and 2 cooling zones. Reflow cycles may range from 1-5. The copper pillars are both physically and electrically contacted to the metal contacts of the substrate. An underfill material may then be injected to fill space between the die, the pillars and the substrate. Conventional underfills which are well known in the art may be used.

Figure 1:
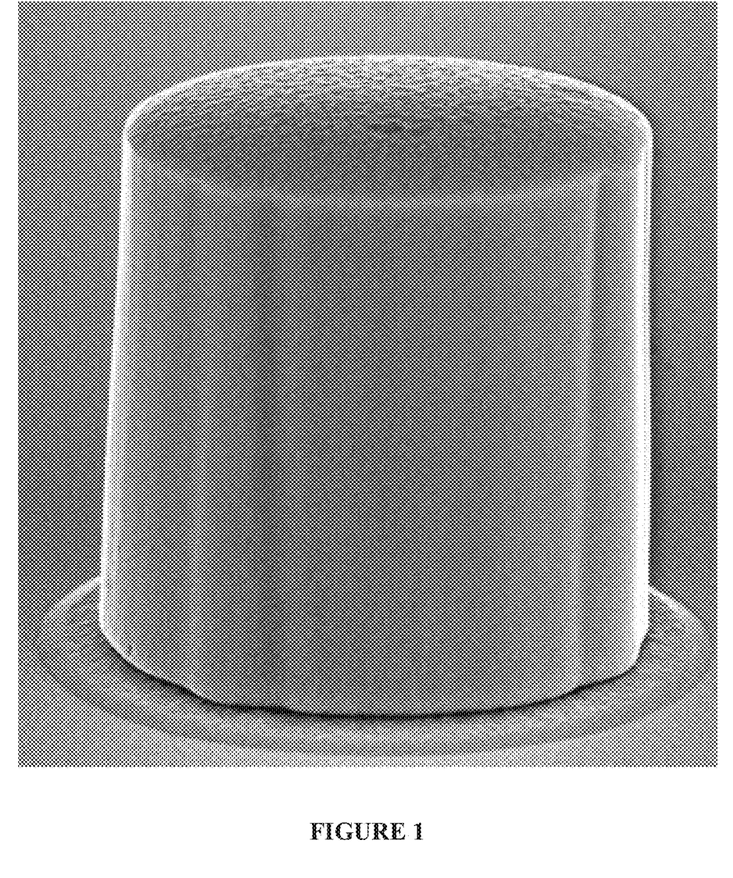
FIG. 1 is a SEM of a copper pillar at 300× electroplated from a copper electroplating bath containing a reaction product of 1H-imidazole and glycerol diglycidyl ether.
Figure 2:
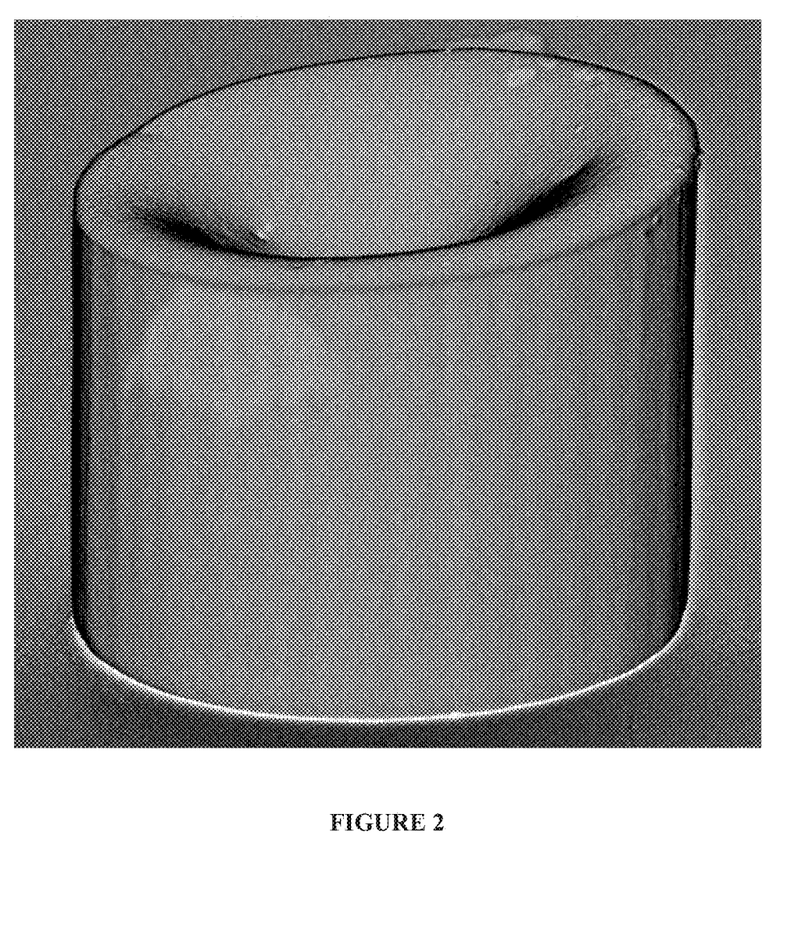
FIG. 2 is a SEM of a copper pillar at 300× electroplated from a copper electroplating bath containing a conventional leveler compound which is a reaction product of 2-methylquinolin-4-amine, 2-(2-aminoethyl)pyridine and 1,4-butanediol diglycidyl ether.

FIG. 1 is a SEM of a copper pillar of the present invention having cylindrical morphology with a base and substantially flat top for electroplating solder bumps. During reflow solder is melted to obtain a smooth surface. If pillars are too domed during reflow, the solder may melt and flow off the sides of the pillar and then there is not enough solder on the top of the pillar for subsequent bonding steps. If the pillar is too dished as shown in FIG. 2, material left from the copper bath which was used to electroplate the pillar may be retained in the dished top and contaminate the solder bath, thus shortening the life of the solder bath.

To provide a metal contact and adhesion between the copper pillars and the semiconductor die during electroplating of the pillars, an underbump metallization layer typically composed of a material such as titanium, titanium-tungsten or chromium is deposited on the die. Alternatively, a metal seed layer, such as a copper seed layer, may be deposited on the semiconductor die to provide metal contact between the copper pillars and the semiconductor die. After the photosensitive layer has been removed from the die, all portions of the underbump metallization layer or seed layer are removed except for the portions underneath the pillars. Conventional processes known in the art may be used.

While the height of the copper pillars may vary, typically they range in height from 1 μm to 200 μm, preferably from 5 μm to 50 μm, more preferably from 15 μm to 50 μm. Diameters of the copper pillars may also vary. Typically the copper pillars have a diameter of 2 μm to 200 μm, preferably from 10 μm to 75 μm, more preferably 20 μm to 25 μm.

The copper electroplating methods and baths provide copper photoresist defined features which have a substantially uniform morphology and are substantially free of nodules. The copper pillars and bond pads have a substantially flat profile. The copper electroplating baths and methods enable an average % TIR to achieve the desired morphology as well as a balance between the average % TIR and % WID.

The following examples are intended to further illustrate the invention but are not intended to limit its scope.

Example 1

Glycerol diglycidyl ether (94.5 mmols) and 1H-imidazole (150 mmols) were added at room temperature to a round-bottom reaction flask set in a heating bath. Then 20 mL of DI water were added to the flask. The temperature of the heating bath was set to 98° C. The reaction mixture was heated for 5 hours and left stirring at room temperature for another 8 hours. The reaction product (reaction product 1) was used without purification. The molar ratio of the moieties from the 1H-imidazole to the molar ratio of the epoxy compound was 100:63.

Example 2

Into a 125 mL round-bottom, three-neck flask equipped with a condenser and a thermometer, 150 mmol of 1H-imidazole and 20 mL of DI water were added. The mixture was heated to 80° C. followed by drop wise addition of 150 mmol of glycerol diglycidyl ether. The resulting mixture was heated for about 4 hours using an oil bath set to 85° C. and then left to stir at room temperature for an additional 4 hours. The reaction product was diluted with water, transferred into a storage container and used without further purification. The molar ratio of the moieties from the 1H-imidazole to the molar ratio of the ether moieties was 1:1.

Example 3

Glycerol diglycidyl ether (63 mmols) and 2,5-dimethyl-1H-imidazole (100 mmols) were added at room temperature to a round-bottom reaction flask set in a heating bath. Then 20 mL of DI water were added to the flask. The temperature of the heating bath was set to 98° C. The reaction mixture was heated for 4 hours and left stirring at room temperature for another 8 hours. The reaction product (reaction product 3) was used without purification. The molar ratio of the moieties from the 1H-imidazole to the molar ratio of the ether moieties was 100:63.

Example 4

An aqueous acid copper electroplating bath was prepared by combining 40 g/L copper ions from copper sulfate pentahydrate, 140 g/L sulfuric acid, 50 ppm chloride ion, 5 ppm of an accelerator and 2 g/L of a suppressor. The accelerator was bis(sodium-sulfopropyl)disulfide. The suppressor was an EO/PO copolymer having a weight average molecular weight of around 1,000 and terminal hydroxyl groups. The electroplating bath also contained 1 ppm of reaction product 1 from Example 1. The pH of the bath was less than 1.

A 300 mm silicon wafer segment with a patterned photoresist 50 μm thick and having a plurality of apertures (available from IMAT, Inc., Vancouver, Wash.) was immersed in the copper electroplating bath. The anode was a soluble copper electrode. The wafer and the anode were connected to a rectifier and copper pillars were electroplated on the exposed seed layer at the bottom of the apertures. Current density during plating was 9 ASD and the temperature of the copper electroplating bath was at 25° C. After electroplating the remaining photoresist was then stripped with BPR alkaline photostripper solution available from the Dow Chemical Company leaving an array of copper pillars on the wafer. The copper pillars were then analyzed for their morphology. The heights and TR of the pillars were measured using an optical white light LEICA DCM 3D microscope. The % TIR was determined by the following equations:

% TIR=[$height_{center}$−$height_{edge}$]/$height_{max}$ and

TIR=$height_{center}$−$height_{edge}$

The average % TIR of the eight pillars was also determined as shown in the table.

TABLE 1

| Pillar # | Pitch (μm) | Pillar Height$_{max}$ (μm) | Pillar TIR (μm) | % TIR |
|---|---|---|---|---|
| 1 | 100 | 34.6 | 2.6 | 7.5 |
| 2 | 100 | 32.2 | 3.0 | 9.3 |
| 3 | 100 | 31.4 | 3.0 | 9.5 |
| 4 | 100 | 31.7 | 3.2 | 10 |

TABLE 1-continued

| Pillar # | Pitch (μm) | Pillar Height$_{max}$ (μm) | Pillar TIR (μm) | % TIR |
|---|---|---|---|---|
| 5 | 100 | 34.8 | 2.9 | 8.3 |
| 6 | 250 | 36.5 | 2.1 | 5.8 |
| 7 | 250 | 35.0 | 1.8 | 5.1 |
| 8 | 250 | 33.3 | 2.1 | 6.3 |
| Avg. | — | 33.7 | 2.6 | 7.7% |

The % WID for the array of pillar was determined using the following equation:

$$\% \text{WID} = \tfrac{1}{2} \times [(\text{height}_{max} - \text{height}_{min})/\text{height}_{avg}] \times 100$$

The % WID was 7.5% and the average % TIR was 7.7%. The surface of the pillars all appeared smooth and free of nodules. The copper electroplating bath which included reaction product 1 plated very good copper pillars. FIG. 1 is a 300× AMRAY SEM image of one of the pillars plated on the seed layer. The surface morphology is smooth and the pillar has a substantially flat surface.

Example 5

The method of Example 4 was repeated except that the reaction product was reaction product 2 from Example 2. The silicon wafer segment, copper electroplating bath and plating conditions were the same. Reaction product 2 was included in the bath in the amount of 1 ppm. After the plating was completed the photoresist was stripped from the wafer with an alkaline stripping solution leaving an array of copper pillars. Eight copper pillars were then analyzed for their morphology.

TABLE 2

| Pillar # | Pitch (μm) | Pillar Height$_{max}$ (μm) | Pillar TIR (μm) | % TIR |
|---|---|---|---|---|
| 1 | 100 | 32.2 | 1.8 | 5.6 |
| 2 | 100 | 29.4 | 1.7 | 5.8 |
| 3 | 100 | 29.5 | 1.6 | 5.4 |
| 4 | 100 | 29.9 | 1.4 | 4.7 |
| 5 | 100 | 31.4 | 1.4 | 4.5 |
| 6 | 250 | 32.7 | 1.9 | 5.8 |
| 7 | 250 | 32.5 | 1.7 | 5.2 |
| 8 | 250 | 32.0 | 1.5 | 4.7 |
| Avg. | — | 32.2 | 1.6 | 5.2% |

All of the pillars were smooth. The % WID was determined to be 5.2% and the average % TIR was determined to be 5.2%. The top of the pillars were substantially flat and no nodules were visible. As a whole the copper pillars had morphology substantially the same as shown in FIG. 1. The quality of the pillars was very good.

Example 6

A 300 mm silicon wafer segment with a patterned photoresist 50 μm thick and a plurality of apertures (available from IMAT, Inc., Vancouver, Wash.) was immersed in the copper electroplating bath of Example 4 above except that the reaction product was reaction product 2 at a concentration of 1 ppm. The anode was a soluble copper electrode. The wafer and the anode were connected to a rectifier and copper pillars were electroplated on the exposed seed layer at the bottom of the apertures. Current density during plating was 9 ASD and the temperature of the copper electroplating bath was at room temperature.

After the wafer was plated with copper pillars, the tops of the copper pillars were then electroplated with a tin/silver solder using SOLDERON™ BP TS6000 tin/silver electroplating solution (available from the Dow Chemical Company, Midland, Mich.). The solder was electroplated up to the level of the photoresist in each aperture. The photoresist was then stripped using an alkaline stripper. The silicon wafers were then reflowed using a Falcon 8500 tool from Sikama International, Inc. having 5 heating and 2 cooling zones using temperatures of 140/190/230/230/260° C., with a 30 second dwell time and a conveyor rate of 100 cm/minute and a nitrogen flow rate of 40 cubic feet/hour (approximately 1.13 cubic meters/hour). ALPA 100-40 flux (Cookson Electronics, Jersey City, N.J., U.S.A) was the flux used in the reflow. One reflow cycle was done. After reflow the eight pillars were cross sectioned using a FIB-SEM and the interface between the copper pillars and the solder were examined for voids. There were no observable voids, thus there was good adhesion between the solder and the copper pillars.

Example 7

The method of Example 4 was repeated except that the reaction product was reaction product 3 from Example 3. The silicon wafer segment, copper electroplating bath and plating conditions were the same. Reaction Product 3 was included in the bath in the amount of 1 ppm. After the plating was completed the photoresist was stripped from the wafer with an alkaline stripping solution leaving an array of copper pillars. Eight copper pillars were then analyzed for their morphology.

TABLE 3

| Pillar # | Pitch (μm) | Pillar Height$_{max}$ (μm) | Pillar TIR (μm) | % TIR |
|---|---|---|---|---|
| 1 | 100 | 39.4 | 2.2 | 5.6 |
| 2 | 100 | 32.9 | 2.6 | 7.9 |
| 3 | 100 | 31.3 | 2.5 | 8.0 |
| 4 | 100 | 31.0 | 2.2 | 7.1 |
| 5 | 100 | 32.6 | 2.2 | 6.7 |
| 6 | 250 | 34.0 | 2.3 | 6.8 |
| 7 | 250 | 36.1 | 1.9 | 5.3 |
| 8 | 250 | 36.9 | 1.9 | 5.1 |
| Avg. | — | 33.3 | 2.2 | 6.6% |

All of the pillars were smooth. The % WID was determined to be 12.3% and the average % TR was determined to be 6.6%. Although the % WID was higher than the % WID of reaction products 1 and 2, the tops of the pillars were substantially flat and no nodules were visible. As a whole the copper pillars had very good morphology.

Example 8

A 300 mm silicon wafer segment with a patterned photoresist 50 μm thick and a plurality of apertures (available from IMAT, Inc., Vancouver, Wash.) was immersed in the copper electroplating bath of Example 4 above except that the reaction product was reaction product 3 at a concentration of 1 ppm. The anode was a soluble copper electrode. The wafer and the anode were connected to a rectifier and copper pillars were electroplated on the exposed seed layer at the bottom of the vias. Current density during plating was 9 ASD and the temperature of the copper electroplating bath was at room temperature.

After the wafer was plated with copper pillars, the tops of the copper pillars were then electroplated with a tin/silver solder using SOLDERON™ BP TS6000 tin/silver electroplating solution (available from the Dow Chemical Company, Midland, Mich.). The solder was electroplated up to the level of the photoresist in each aperture. The photoresist was then stripped using an alkaline stripper. The silicon wafers were then reflowed using a FALCON 8500 tool from Sikama International, Inc. having 5 heating and 2 cooling zones using temperatures of 140/190/230/230/260° C., with a 30 second dwell time and a conveyor rate of 100 cm/minute and a nitrogen flow rate of 40 cubic feet/hour (approximately 1.13 cubic meters/hour). ALPA 100-40 flux (Cookson Electronics, Jersey City, N.J., U.S.A) was the flux used in the reflow. One reflow cycle was done. After reflow the eight pillars were cross sectioned using a FIB-SEM and the interface between the copper pillars and the solder were examined for voids. There were no observable voids, thus there was good adhesion between the solder and the copper pillars.

Example 10 (Comparative)

In a 125 mL round-bottom, three-neck flask equipped with a condenser and a thermometer, 90 mmol of 2-methylquinolin-4-amine, 10 mmol of 2-(2-aminoethyl)pyridine were added into a mixture of 20 mL of DI water and 5 ml of 50% sulfuric acid. The mixture was heated to 80° C. followed by drop wise addition of 100 mmol of 1,4-butanediol diglycidyl ether. The resulting mixture was heated for about 4 hours using an oil bath set to 95° C. and then left to stir at room temperature for an additional 8 hours. The reaction product (reaction product 4-comparative) was diluted using acidified water and was used without further purification.

Example 11 (Comparative)

The method described in Example 4 was repeated with the same copper electroplating bath, wafer and plating parameters except reaction product 4-comparative was substituted for reaction product 1. Reaction product 4-comparative was included in the copper electroplating bath in an amount of 1 ppm. After the wafer was plated with pillars, the photoresist was stripped leaving an array of copper pillars on the silicon wafer. The pillars appeared rough and many had "sink-hole" centers as shown in FIG. 2. The % WID and average % TIR were not calculated. The pillars were very defective, thus the profilometer was unable to read them accurately.

What is claimed is:

1. A method of electroplating photoresist defined features comprising:
   a) providing a substrate comprising a layer of photoresist, wherein the layer of photoresist comprises a plurality of apertures;
   b) providing a copper electroplating bath comprising a source of copper ions, one or more reaction products of one or more imidazole compounds and one or more bisepoxides; an electrolyte; one or more accelerators; and one or more suppressors;
   c) immersing the substrate comprising the layer of photoresist with the plurality of apertures in the copper electroplating bath; and
   d) electroplating a plurality of copper photoresist defined features in the plurality of apertures, the plurality of photoresist defined features comprise an average % TIR of 5% to 8%.

2. The method of claim 1, wherein a % WID of the plurality of photoresist defined features is from 5% to 12%.

3. The method of claim 1, wherein the one or more imidazole compounds have a formula:

(I)

wherein $R_1$, $R_2$ and $R_3$ are independently chosen from a hydrogen, linear or branched $(C_1-C_{10})$alkyl, hydroxyl, linear or branched alkoxy, linear or branched hydroxy $(C_1-C_{10})$alkyl, linear or branched alkoxy$(C_1-C_{10})$alkyl, linear or branched, carboxy$(C_1-C_{10})$alkyl, linear or branched amino$(C_1-C_{10})$alkyl, and substituted or unsubstituted phenyl.

4. The method of claim 3, wherein $R_1$, $R_2$ and $R_3$ are independently chosen from hydrogen and $(C_1-C_3)$alkyl.

5. The method of claim 1, wherein the one or more bisepoxide compounds have a formula:

(II)

wherein $R_4$ and $R_5$ are independently chosen from hydrogen and $(C_1-C_4)$alkyl; $R_6$ and $R_7$ are independently chosen from hydrogen, methyl and hydroxyl; m=1-6 and n=1-20.

6. The method of claim 1, wherein the reaction product is in amounts of 0.25 ppm to 20 ppm.

7. The method of claim 1, wherein electroplating is done at a current density of 0.25 ASD to 40 ASD.

8. The method of claim 1, wherein the one or more copper photoresist defined features are pillars, bond pads or line space features.

* * * * *